United States Patent [19]

Narcus

[11] 4,160,049

[45] Jul. 3, 1979

[54] BRIGHT ELECTROLESS PLATING PROCESS PRODUCING TWO-LAYER NICKEL COATINGS ON DIELECTRIC SUBSTRATES

[76] Inventor: Harold Narcus, 15 Vesper St., Worcester, Mass. 01602

[21] Appl. No.: 849,165

[22] Filed: Nov. 7, 1977

[51] Int. Cl.² .............................................. C23C 3/02
[52] U.S. Cl. .................................. 427/277; 204/38 B; 427/305; 427/306; 427/307; 427/404; 427/430 A; 427/438
[58] Field of Search ........... 427/404, 305, 438, 430 A, 427/306, 307, 277; 204/38 B

[56] References Cited

U.S. PATENT DOCUMENTS

| 3,212,917 | 10/1965 | Tsu et al. | 427/305 |
|---|---|---|---|
| 3,817,774 | 6/1974 | Kuzmik | 427/304 |
| 3,878,007 | 4/1975 | Feldstein et al. | 427/259 |
| 3,953,624 | 4/1976 | Arnold | 427/438 |
| 3,959,523 | 5/1976 | Grunwald et al. | 427/404 |

OTHER PUBLICATIONS

Industrial Finishing, "How to Get Quality Plated Plastic Parts", pp. 36-39, Nov. 1977.
Pearlstein, Modern Electroplating, John Wiley & Sons, pp. 710-725, c 1974.
Pushpavanam et al., Finishing Industries, pp. 48-58, Jun. 1977.

Primary Examiner—John D. Smith
Attorney, Agent, or Firm—Jerry Cohen

[57] ABSTRACT

An adherent, bright metallic nickel coating is applied to the surface of a plastic or other dielectric part (or to a metal part) by an electroless process comprising, after suitable pretreatment of said surface, the deposition of a primary electroless nickel possessing special properties followed by a secondary electroless nickel of bright appearance with complete elimination of any subsequent electroplating process usually required to achieve this brightness. The nickel coating may be limited to selected surface areas of a coated part by mechanically removing portions of the primary coat prior to immersion of the part in a secondary electroless nickel bath.

11 Claims, No Drawings

BRIGHT ELECTROLESS PLATING PROCESS PRODUCING TWO-LAYER NICKEL COATINGS ON DIELECTRIC SUBSTRATES

BACKGROUND OF THE INVENTION

The present invention relates to nickel coating particularly for plastic and other dielectric articles.

Electroless or autocatalytic deposition of metallic coatings on non-conductive or dielectric surfaces, such as plastics, is a well known process with broad applications in diversified industries such as automotive, radio, television, plumbing, marine, home appliance, etc. However, for the benefit of clarity to the non-artisan, it is stated here electroless plating which is the subject of this invention and referred to frequently throughout this disclosure requires no electricity for metallic deposition while electroplating or electrodeposition requires its employment. The field is generally described in my book, "Metallization of Plastics" (Reinhold, New York 1960), see also the U.S. patents cited below.

Heretofore, the application of the electroless coating to surfaces of substrates [following pretreatment of said surfaces] was followed by the commonly used electroplating or electrodeposition process known to the industry particularly electroplated copper, nickel, chromium, gold, silver, etc. to achieve bright surfaces for decorative or functional purposes. These prior art processes involve chemical etching of the plastic substrate mainly to improve adherence of metal thereto, then sensitizing and activating this etched surface, applying a conductive film of silver, copper or nickel in electroplating of the desired metal upon this conductive film.

Recent improvements have eliminated the two-step treatment [i.e. 1 - sensitizing and 2 - activating] and replaced it with a one-step pretreatment involving colloidal solutions containing non-noble copper ions or noble palladium ions; then a conductive film of copper or nickel is formed and, finally, electroplating metal is applied.

As an example of the non-noble catalyst treatment referred to, the U.S. Pat. No. 4,020,197 issued to Steffen (Apr. 26, 1977) treats the plastic surface in a solution of cuprous chloride, acidified with 10-15% hydrochloric acid, followed by hydrolysis of the cuprous (1) compound to a hydrous oxide in hot water; then acceleration in an alkaline solution of sodium borohydride. Innumerable patents issued to Feldstein such as U.S. Pat. Nos. 3,993,799, 3,993,848, 3,993,801, 3,993,491, 3,993,799 and 3,982,054 also practice the employment of the so-called non-noble metal catalyst for treatment of non-conductive surfaces.

As an example of the noble catalyst referred to, a patent was issued to Shipley, U.S. Pat. No. 3,011,920 (Dec. 5, 1961) in which the nobel metal, e.g., palladium, is applied directly to the dielectric surface in the form of a colloidal solution containing the metal in zero valence state. Normally, the metal is formed in the colloidal solution by introducing both palladium chloride and stannous chloride into a highly acidified (with hydrochloric acid) aqueous solution, the palladium ions being reduced within the solution to this zero valence state by the stannous ions. U.S. Pat. No. 3,672,938 issued June 27, 1972, to Zeblisky and U.S. Pat. No. 3,767,583 issued Oct. 23, 1973, to Fadgen and Saubestre also practice the use of the noble catalyst solution.

Processes of the above nature involving pretreatment and formation of a conductive film of copper or nickel for making the plastic conductive followed by electroplating have been commercially successful but have many technical and economic disadvantages.

From a technical point of view, intricate parts with blind-holes, threads, small diameter holes, slots, recesses or internal areas do not receive uniform electroplating because, by nature, certain plating baths have poor throwing power; for example, as in the case of chromium plating, and costly auxiliary anode assemblies, commonly employed in the industry must be used to plate into these extremely low current density areas. Excessive plated metal occurs on the high current density areas, such as sharp corners, protrusions, etc., while little or even no plating takes place in the low current density areas such as grooves, holes, slots, etc. In other words, uneven thickness of electrodeposits result due to the fact that the high current density areas receive more metal than the low current density areas.

Economically, the cost for applying an electroplated coating to the plastic is much greater because of the relatively thick deposits applied to the conductive film of copper or nickel. Excessive metal costs are incurred.

Furthermore, plastic parts, especially those large in size, require placement on plating racks for acceptable electroplating results. Fixture costs and labor for attaching the parts to said fixture bring about these additional process expenditures. Furthermore, unplated contact points appear where the parts are held on these fixtures which is highly objectionable in critical industrial applications.

There is a need for electroless plating compositions and processes producing bright deposits especially in the decoration of plastics which will overcome the aforementioned disadvantages while still being compatible with known commercial procedures. The present invention provides said compositions and processes.

While the application of bright electroless nickel deposits, applied in bulk or mass handling, or with rack handling, is common practice when these deposits are applied to non-ferrous or ferrous substrates, the brightness can only be achieved by bright-dipping or polishing the metal substrate first to obtain these bright electroless finishes. Non-conductive surfaces are normally impossible to bright dip and polishing of non-conductive surfaces is not feasible since there would be a loss of adhesion of the electroless nickel to the nonconductive surface due to the absence of mechanical or chemical interlocking of the metallic nickel coating.

It is the principal object of the present invention to provide an effective and economical process for electrolessly applying attractive, bright metallic coatings of nickel to non-conductive surfaces, particularly a wide variety of synthetic resins, for example, acrylonitrile-butadiene styrene (ABS), without the necessity of subsequent electroplating or electrodeposition.

It is a further particular object of the present invention to provide a process whereby plastic parts, no matter how intricate in shape, form, or design, can receive a bright nickel coating uniformly deposited throughout the entire part without using costly racking and auxiliary anode assemblies to insure this uniform metal thickness in both high and low current density areas. In other words, the object is to provide a process wherein parts may be processed in bulk or in mass without the necessity of racking and still receive bright deposits of electroless nickel with complete elimination of the need for electroplated deposits and related burdens of process and equipment.

SUMMARY OF THE INVENTION

The process of the present invention is applicable to the metallic coating, with nickel, of a wide variety of dielectric substrates but is best employed commercially to apply bright nickel to plastics such as acrylonitrile-butadiene styrene (ABS). Other non-conductive substrates described in the prior art, including the broad range of thermoplastic and thermosetting resins, glass, ceramics, etc., may be suitably electrolessly coated with nickel in accordance with the present invention. In practice, these substrates are surface conditioned or etched in the manner known to the artisan prior to the electroless process in order to improve the adherence of the metallic nickel. The etched substrate is then sensitized and activated in a one-stage or two-stage process (preferably one-stage) utilizing the noble or non-noble activator or catalyst previously discussed. The pretreated substrate is then coated with electroless nickel, termed in this invention, the Primary Electroless Nickel, applied from a special composition to produce a dense, levelled electroless nickel deposited in proper thickness to act as a suitable foundation metal for receiving a Secondary Electroless Nickel possessing attractive brightness. This combination of a primary and secondary electroless nickel gives a resulting bright, attractive uniform deposit to the plastic substrate. No subsequent electroplating such as with electroplated copper, nickel, chromium, as necessary in the prior art, is further required in the present invention.

Parts of the primary electroless nickel coating may be mechanically removed prior to applying the secondary nickel coating by immersion of the substrate in the secondary nickel bath. The secondary nickel coat (overlayer) is produced only in those substrate surface areas having primary nickel underlayer.

The secondary nickel coat can be supplemented by other metal coatings.

The primary nickel bath is maintained basic [8.0–10.0 pH preferably 8.5–9.0] and the secondary nickel bath is maintained acidic [4.0–6.0 pH, preferably 4.5–5.5].

In both the primary and secondary nickel coating baths, solutions of nickel salts in polar solvents (preferably aqueous) are employed together with a source of phosphorous, preferably alkali metal or ammonium hypophosphite producing a nickel-phosphorous alloy in the final product throughout both primary underlayer coat and the secondary underlayer coat.

The resultant product is characterized by high reflectivity and adhesion.

Other objects, features and advantages of the present invention will be apparent to those skilled in the art from the following detailed description of preferred embodiments thereof.

DETAILED DESCRIPTION OF PREFERRED EMBODIMENTS

More specifically, the improved process of the present invention is comprised of the following sequence of steps used, for example, with acrylonitrile-butadiene styrene (ABS) which is selected because of its excellent platability:

(1) Surface condition or etch the ABS using the conventional chromic acid-sulphuric acid aqueous solution
(2) Rinse in water.
(3) Neutralize residual etch solution in a dilute sodium bisulfite solution.
(4) Rinse in water.
(5) Activate in the one-stage non-noble or noble catalyst solution.
(6) Rinse in water.
(7) Accelerate in an alkaline sodium borohydride or dilute fluoboric acid solution.
(8) Rinse in water.
(9) Apply the Primary Electroless Nickel (foundation metal).
(10) Apply the Secondary Electroless Nickel (bright deposit).

Examples 1 and 2 which follow are more specific illustrative (non-limiting) detailed descriptions of practice of the present invention as applied to plastic radio knobs molded in a platable grade of acrylonitrile-butadiene styrene (ABS). All solutions and baths are aqueous.

EXAMPLE 1

(1) Etch the part in the conventional chromic acid-sulphuric acid solution of the following composition:
Chromic Acid ($CrO_3$ — 184 grams/liter
Sulphuric Acid ($H_2SO_4$) (66° Bè) — 368 grams/liter
Fluorad FC-95 — 1 gram/liter
Fluorocarbon surfactant
Treatment - 5 minutes at 65°–70° C.
(2) Water rinse
(3) Neutralize
Sodium bisulfite ($Na_2S_2O_4 \cdot 2 H_2O$) - 150–200 grams/liter
Treatment — 1 minute at 25°–30° C.
(4) Water rinse
(5) Activate (non-noble catalyst)
Acidified cuprous chloride solution (CuCL-HCL)
Treatment — 15 minutes at 40° C. Supplied by — Kollmorgan Technologies, Inc. (Dallas, Texas) or Surface Technologies, Inc. (Princeton, N.J.)
(6) Hot water rinse - 5 minutes
(7) Acceleration
Sodium borohydride ($NaBH_4$) — 1 gram/liter
Sodium hydroxide (NaOH) — 1 gram/liter
Fluorad FC-95 surfactant (1% solution) — 1 ml/liter
Treatment — 10 minutes at 30° C.
(8) Water rinse
(9) Primary Electroless Nickel Bath Immersion
Nickel Sulphate ($NiSO_4 \cdot 6 H_2O$) — 45 grams/liter
Ammonium chloride ($NH_4CL$) — 30 grams/liter
Sodium citrate ($Na_3C_6H_5O_7 \cdot 2H_2O$) — 5 grams/liter
Glacial acetic acid ($CH_3COOH$) — 10 grams/liter
Sodium hypophosphite ($NaH_2PO_2 \cdot H_2O$) — 40 grams/liter
Ammonium hydroxide ($NH_4OH$ 26° Bè — 45 grams/liter
Operating Conditions
Temperature 25°–30° C.
pH 8.5–9.0
Time — 10 minutes

(10) Secondary Electroless Nickel Bath Immersion
Nickel sulphate ($NiSo_4 \cdot 6H_2O$) — 20 grams/liter
Lactic acid (80%) ($CH_3CHOH \cdot COOH$) — 30 grams/liter
Propionic acid ($CH_3 \cdot CH_2 \cdot COOH$) — 2 grams/liter
Lead acetate (Pb 2.3$H_2$) — 0.001 grams/liter Sodium hypophosphite ($NaH_2PO_2 \cdot H_2O$) — 25 grams/liter
Operating Conditions
Temperature — 70°–90° C.
pH 4.5–5.5
Time 20–30 minutes

EXAMPLE 2

Steps (1) through (4) – same as in Example 1. Then:
(5) Activate (Noble catalyst): Catalyst #9-A of Shipley Company, Wellesley, Mass. or Enthone Activator #442 of Enthone, Inc., New Haven, Conn.
(6) Water Rinse
(7) Acceleration: 10% (by volume) Fluoboric Acid ($HBF_4$). Treatment: ½ – 1 minute at 25°–30° C.
(8) Water Rinse
(9)-(10) The primary electroless and second electroless nickel compositions are the same as in steps (9) and (10) in Example 1.

The pH values for the primary and secondary electroless nickel compositions shown in Steps (9) and (10) of Examples 1 and 2 must be held within the limits indicated for distinct advantage and are preferably controlled with 1:1 ammonium hydroxide solution for raising the values and a 25% sulphuric acid (by volume) for lowering the values.

The deposits of electroless nickel derived from both the primary and secondary electroless nickels preferably comprise alloys of nickel and phosphorus (6–12% P) with an approximate average value of 7% phosphorus through use of hypophosphites in the primary and secondary baths. The actual percentage of phosphorus depends on the age of each bath.

The hardness of the two layer deposit — VICKERS DPH — shows a microhardness of 400–600 (average 500 VICKERSO - 49 ROCKWELL C. Reflectivity values of the overlayer (secondary nickel) are on the order of 80–90% in the secondary if properly maintained. By maintaining a high degree of purity, especially in the secondary nickel, the bath has long life. Its brightness, under ideal conditions, is exceptional since, in prior art, electroless nickels were not considered as bright as deposits obtained from electrolytic or electroplated nickels.

This brightness in the secondary electroless nickel is obtained by using commercially available, proprietary brighteners of the type used in electrolytic bright nickels. In prior art, brighteners of this type have not found significant utilization in electroless nickel deposition. Brighteners used in the secondary electroless nickel of Examples 1 and 2 are Udylite 610, 63 supplied by Udylite Corp. (Detroit, Mich.) in the order of 0.5%–1% and 1.5–2.0% respectively. Udylite 62A wetting agent is optional but seems to offer certain advantages. Other brighteners usually used in electrolytic nickel baths which may be used in the present electroless baths are supplied by Harshaw Chemical Company (Cleveland, Ohio), M&T Chemical (Rahway, N.J.) and Sel-Rex Chemical (Newark, N.J.).

The ductility of the primary electroless nickel is excellent and its metallurgical properties are highly satisfactory for a foundation coating for the applied secondary electroless nickel. The secondary nickel is bright but less ductile than the primary nickel but entirely satisfactory for applications in industry.

The rate of deposition from both the primary and secondary nickels is 0.0006" to 0.0008" per hour under properly controlled bath compositions with mechanical or air agitation and continuous filtration of the baths which are preferred conditions.

It is important to point out that the primary and secondary nickels shown in Examples 1 and 2 must be employed jointly for the best practice of this invention. Using only the primary electroless nickel will produce a dull or, at best, a semi-bright deposit while the employment of only the secondary nickel will give a bright but less adherent coating of nickel with possible deformation of certain thermoplastic substrates due to the high temperature of operation of this bath. Furthermore, using only the secondary nickel will produce a highly-stressed, brittle deposit with a tendency towards flaking and peeling, Hence, in the practice of this invention, there is the necessity of a so-called DUAL NICKEL SYSTEM, as described herein, wherein the primary electroless nickel acts as a foundation eliminating the aforementioned problems.

The primary nickel is a smooth or levelled, dense or close-grained, pore-free deposit adherent to the properly pretreated plastic substrate and tolerant to drag-in impurities from the pretreatment solutions.

The secondary electroless nickel has self-building brightness; i.e., the thicker the coating, the brighter the deposits. If desired, this bright coating can be coated further electrolessly with electroless chromium, gold, silver, copper, etc. to achieve different shades of deposits other than the color characteristic to electroless nickel. This is obvious to the skilled artisan.

Within the scope of this invention is an important industrial process of selective electroless coating made possible only by utilization of the process disclosed above.

An automotive radio knobs, for example, molded out of black ABS material is electrolessly coated with the primary electroless nickel described above. The center section of this knob is machined on a wood turning lathe or similar equipment (e.g., on a Miller, shaper, grinder) to remove the thin layer (0.000010 – 0.00015") of this ductile, machinable primary nickel from this center section of the knob to expose black plastic. The part then receives the bright secondary electroless nickel by immersion in a secondary nickel bath. The net result is a bright automotive knob metallized all over with bright electroless nickel except at the center section where the originally molded black ABS plastic is exposed. In other words, an attractive combination of metal and plastic is achieved.

The intermediate machining step obliterates surface activation history in the treated area so that no secondary nickel adheres to the mechanically treated portion. No finishing steps are necessary. However, the treated area should be rinsed.

Prior methods employed to accomplish selective metallizing required the use of costly spray masks or stencils in conjunction with stop off paints or inks or silk-screen or photographic procedures as used in printed circuitry, hot stamping, adhesive-backed inserts, two-shot molding, etc.

Furthermore, since the disclosed process is a total electroless method requiring no subsequent electroplating, costly complex racking for electrical connection is totally eliminated. Hence, the net result is a low cost selective plating process.

Other applications for selectively decorating plastic items for the novelty field include selective plating of jewelry items, buttons, placques, etc. A variety of geometric designs are now obtainable. In mass production, automatic cutting machines can be adapted economically to remove the primary electroless nickel in the predetermined areas prior to the application of the bright secondary electroless nickel.

It will be understood that several nickel salts can be used in lieu of nickel sulphate incorporated in the above examples — e.g., nickel chloride, nickel acetate, nickel ammonium sulphate. Brighteners used include many organics, e.g., naphthalene sulfonic acid, and inorganic, e.g., cobalt sulphate compounds and are, per se, well known in the art. The phosphorous compound used as a reducing agent may be replaced in whole or part by a boron compound, e.g., dimethyl amine borane (DMAB) or sodium borohydride, resulting in boron instead of phosphorous included in the resulting coating.

Although the invention has been described and illustrated in detail, it is clearly understood that the same is by way of illustration and example and is not taken by way of limitation, the spirit and scope of this invention being limited only by the terms of the appended claims which follow.

What is claimed is:

1. Method of producing adherent, decorative, two-layer nickel coatings on dielectric substrates comprising, activating the substrate surface, electrolessly depositing a first dull nickel alloy layer thereon comprising 6–12% phosphorus, balance essentially nickel, in a first electroless coating bath, the layer being dense and levelled, and subsequently producing a second nickel-phosphorus alloy layer of self building brightness over the first layer by electroless coating in a second, different electroless coating bath, the second bath also producing a 6–12% phosphorus, balance essentially nickel, composition, and wherein the coating rates in both the first and second baths are controlled to be 0.0006"–0.0008" per hour with the first layer coating stepbeing long enough to produce an adherent 0.000010"–0.00015" thickness (i.e., 2500–37,500 Angstroms) first layer and the second layer coating being carried out long enough to produce a second coating layer which is even thicker than the first coating layer.

2. The method of claim 1 wherein the two coating baths contain $MH_2OP_2 \cdot H_2O$ where M is selected from the class consisting of alkali metal and ammonium ions.

3. The method of claim 1 wherein both the primary and secondary baths have the same nickel compound source.

4. The method of claim 3 wherein nickel sulfate comprises said common nickel source.

5. Method of nickel coating in accordance with claim 1 comprising, etching and activating the substrate surfaces in a single step, acceleration treatment of the substrate surfaces, immersing of the substrates in a primary nickel solution maintained at 25°–30° C. and pH of 8.5–9.0 for 5–15 minutes to produce a foundation nickel coating therein, and then immersing the substrate without rinsing or neutralization, or taking into a secondary, different, nickel solution maintained at 70°–90° C. and 4.5–5.5 pH to produce a self building brightening of the substrate surfaces.

6. Method of nickel coating in accordance with claim 5 wherein the secondary nickel treatment is supplemented by deposition of at least one additional metal.

7. Method of nickel coating in accordance with claim 5 wherein a portion of the foundation coating is removed prior to the said second immersion of the substrates into nickel solution.

8. Method in accordance with claim 5 wherein said primary nickel solution comprises nickel sulfate and sodium hypophosphite and a basic mixture including glacial acetic acid and ammonium hydroxide and said secondary nickel solution comprises nickel sulphate, sodium hypophosphite and a weak acid mixture.

9. Nickel coating method in accordance with claim 1 wherein the second bath is carried out at lower temperature than the first bath, wherein the coating steps are controlled so that the second layer is thicker than the first coating layer and wherein the pH of said first bath is controlled to be 8.0–10.0 and that of the second bath to be 4.0–6.0.

10. The method of claim 9 wherein the first bath is maintained at under 50° C. and the second bath above 50° C. and substantially above the temperature of the first bath.

11. Nickel coating method in accordance with claim 1 wherein selected area portions of the first coating layer are removed by machining prior to exposure of the first-layer-coated substrate to the second bath wherey the second coating layer is not produced in the machined surface areas.

* * * * *